United States Patent
Kamemoto et al.

(10) Patent No.: US 7,312,998 B2
(45) Date of Patent: Dec. 25, 2007

(54) HEAT RADIATING APPARATUS IN ELECTRONIC DEVICE AND HEAT RADIATING METHOD

(75) Inventors: Kazuhiro Kamemoto, Fukaya (JP); Hideo Tsurufusa, Tokyo (JP); Takehiko Numata, Hidaka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 11/225,779

(22) Filed: Sep. 13, 2005

(65) Prior Publication Data

US 2006/0176672 A1   Aug. 10, 2006

(30) Foreign Application Priority Data

Feb. 8, 2005  (JP) .............................. 2005-031953

(51) Int. Cl.
  *H05K 7/20*  (2006.01)
  *H05K 9/00*  (2006.01)
  *F28D 15/00*  (2006.01)

(52) U.S. Cl. ...................... 361/719; 361/704; 361/709; 361/800; 361/816; 361/818; 165/104.33; 165/185

(58) Field of Classification Search ................ 361/704, 361/707, 714, 719, 800, 816, 818; 165/80.3, 165/185, 104.33
See application file for complete search history.

(56) References Cited

U.S. PATENT DOCUMENTS

| | | | |
|---|---|---|---|
| 5,060,114 A | 10/1991 | Feinberg et al. | |
| 5,384,940 A | 1/1995 | Soule et al. | |
| 5,748,444 A | 5/1998 | Honda et al. | |
| 6,388,189 B1 | 5/2002 | Onoue | |
| 6,445,583 B1 | 9/2002 | Kline et al. | |
| 6,545,871 B1* | 4/2003 | Ramspacher et al. | 361/709 |
| 6,673,998 B1* | 1/2004 | Wu | 174/383 |
| 7,061,773 B2* | 6/2006 | Chen | 361/816 |
| 7,095,626 B2* | 8/2006 | Seidler | 361/816 |
| 2004/0190260 A1 | 9/2004 | Sasaki | |

FOREIGN PATENT DOCUMENTS

| | | |
|---|---|---|
| JP | 08-279689 | 10/1996 |
| JP | 09-064582 | 3/1997 |
| JP | 2002-190684 | 7/2002 |
| JP | 14-368481 | 12/2002 |
| JP | 2002-359330 | 12/2002 |

* cited by examiner

*Primary Examiner*—Jayprakash Gandhi
*Assistant Examiner*—Robert J Hoffberg
(74) *Attorney, Agent, or Firm*—Blakely Sokoloff Taylor & Zafman, LLP (57) ABSTRACT

According to one embodiment, a heat radiating apparatus comprises a shielding case having holding panels thereof arranged at locations substantially opposite to a circuit component to extend from a flat panel of the shielding case, which extends substantially parallel to a circuit board, towards the circuit board so as to cover the surface of the circuit board on which a circuit component is mounted. The head radiating apparatus further comprises a heat sink attached to the holding panels of the shielding case for coming into direct contact with the heat conductive sheet on the circuit component when the circuit board is covered with the shielding case.

7 Claims, 7 Drawing Sheets

HEAT RADIATING APPARATUS IN ELECTRONIC DEVICE AND HEAT RADIATING METHOD

CROSS-REFERENCE TO RELATED APPLICATIONS

This application is based upon and claims the benefit of priority from prior Japanese Patent Application No. 2005-031953, filed Feb. 8, 2005, the entire contents of which are incorporated herein by reference.

BACKGROUND

1. Field

Embodiments of the present invention relate to an electronic device such as a digital television broadcast receiving apparatus, and in particular, to a heat radiating apparatus and a heat radiating method for radiating the heat generated by its circuit components.

2. Description of the Related Art

As is well known, digital television broadcasting is now being promoted. In Japan, digital terrestrial broadcasting and digital direct broadcasting by satellite (DBS) have begun.

A conventional digital broadcast receiving apparatus for receiving digital TV signals is required to conduct high-speed processing, particularly of the digital video data. As its large-scale integration (LSI) component devices generate considerable heat during high-speed processing, the digital TV broadcast receiving apparatus must include a scheme for radiating the heat.

Disclosed in Jpn. Pat. Appln. KOKAI Publication No. 9-64582 is an arrangement in which a shielding case has a planer surface provided with a through hole parallel to its circuit board surface and a separate metallic strip is installed around the through hole in direct contact with each heat generating component mounted on the circuit board. In this case, the separate metallic strip is attached to the shielding case with a pair of its projections clamping the inner edge at the through hole from both sides along the depth (thickness) direction, the projections projecting in parallel to the shielding case surface.

Also U.S. Pat. No. 6,445,583 generally discloses an arrangement in which a shielding case has a planer surface thereof provided with a through hole parallel to its circuit board surface and a cover member is installed around the through hole in direct contact with each heat generating component surface mounted on the circuit board. The cover member is attached by an elasticity aided cam construction to the inner edge at the through hole of the shielding case.

Furthermore, U.S. Pat. No. 5,060,114 discloses an arrangement in which a heat sink also acting as a shielding case is provided in direct contact with each heat-generating component by a gel pad which has a degree of flexibility. In this case, the heat sink remains pressed against the heat generating components by its yielding elastic force. Other arrangements for directly pressing a heat-radiating member by the action of a leaf or coil spring against the heat generating components are disclosed in Jpn. Pat. Appln. KOKAI Publication No. 2002-359330 and U.S. Pat. No. 5,384,940.

DETAILED DESCRIPTION

Figure 1:
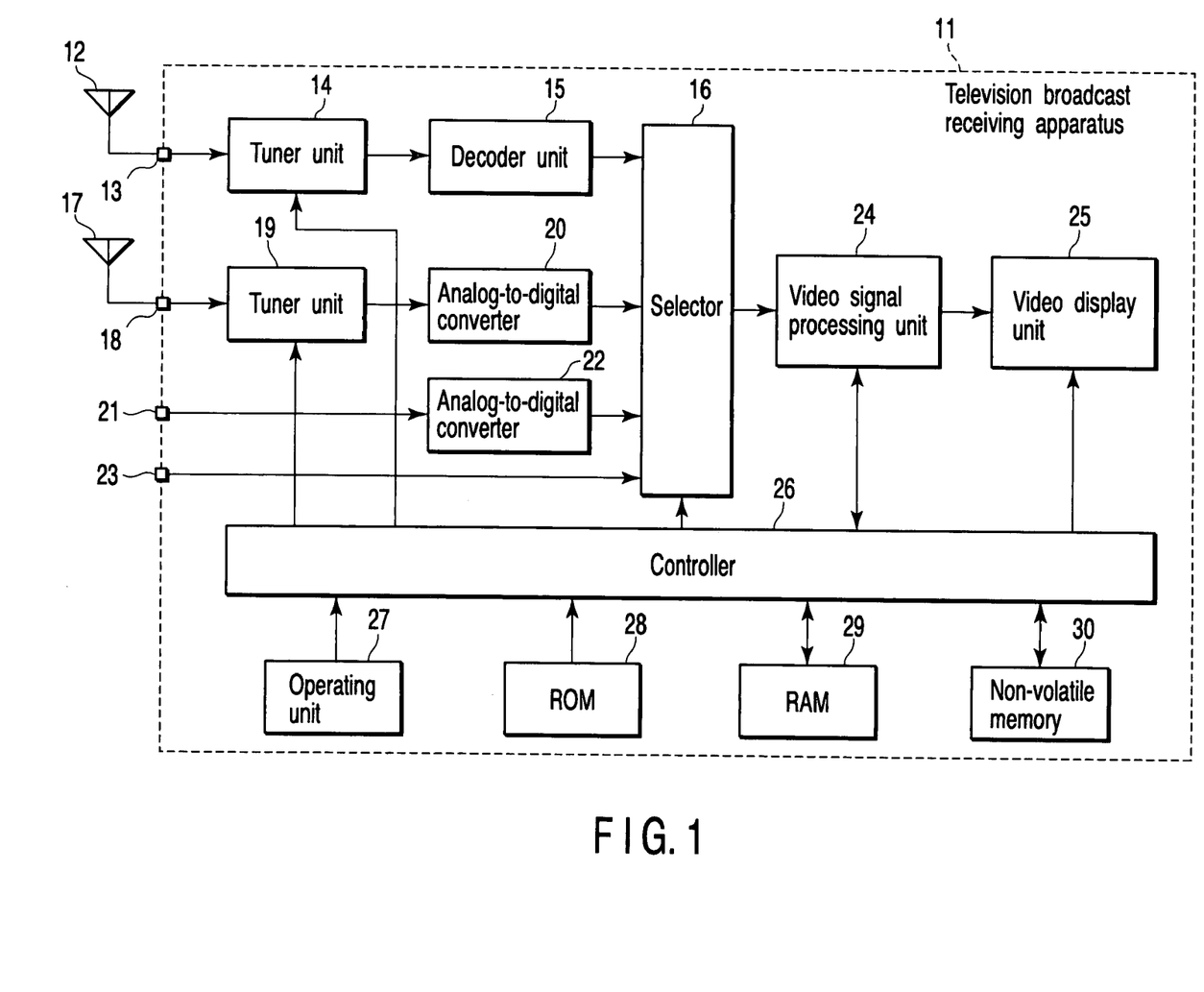
FIG. 1 is an exemplary block diagram of a video signal processing system in a television broadcast receiving apparatus showing one embodiment of the present invention.

One embodiment of the present invention will be described in more detail referring to the relevant drawings. FIG. 1 schematically illustrates a video signal processing system of a television broadcast receiving apparatus 11 according to the embodiment. More specifically, a digital television broadcast signal is received by a digital television broadcast receiving antenna 12 and transferred via an input terminal 13 to a tuner unit 14.

The tuner unit 14 is provided for selectively demodulating the input digital television broadcast signal at a desired channel. A demodulated signal output from the tuner unit 14 is supplied to a decoder unit 15 where it is decoded to a video format such as a Moving Picture Experts Group signal (e.g., MPEG-2 signal), which is then supplied to a selector 16.

An analog television broadcast signal received by an analog television broadcast receiving antenna 17 is transferred via an input terminal 18 to a tuner unit 19. The tuner unit 19 is provided for selectively demodulating the input analog television broadcast signal at a desired channel. A demodulated signal output from the tuner unit 19 is digitized by an analog-to-digital converter 20 before being output to the selector 16.

An analog video signal supplied to an analog video signal external input terminal 21 is digitized by an analog-to-digital converter 22, and output to the selector 16. Similarly, a digital video signal supplied to a digital video signal external input terminal 23 is directly supplied to the selector 16.

The selector 16 is provided for selecting one of the four input digital video signals and transmitting the same to a video signal processing unit 24. The input digital video signal is subjected to a signal processing of the digital signal processing unit 24 and transferred to a video display unit 25 for display. The video display unit 25 may be implemented by, for example, a flat panel display such as a liquid crystal display or a plasma display.

The fundamental actions of the television broadcast receiving apparatus 11 including the above-described receiving actions are totally controlled by a controller 26. According to one embodiment, the controller 26 is a microprocessor incorporating a central processing unit (CPU) for controlling the action of each component in response to operating information received from an operating unit 27 such as a remote controller (not shown).

In this case, more specifically, the controller 26 utilizes a read only memory (ROM) 28 in which the control programs to be executed by the CPU are stored, a random access memory (RAM) 29 to provide a working area for the CPU, and a non-volatile memory 30 in which a variety of setting and controlling information is stored.

Figure 2:
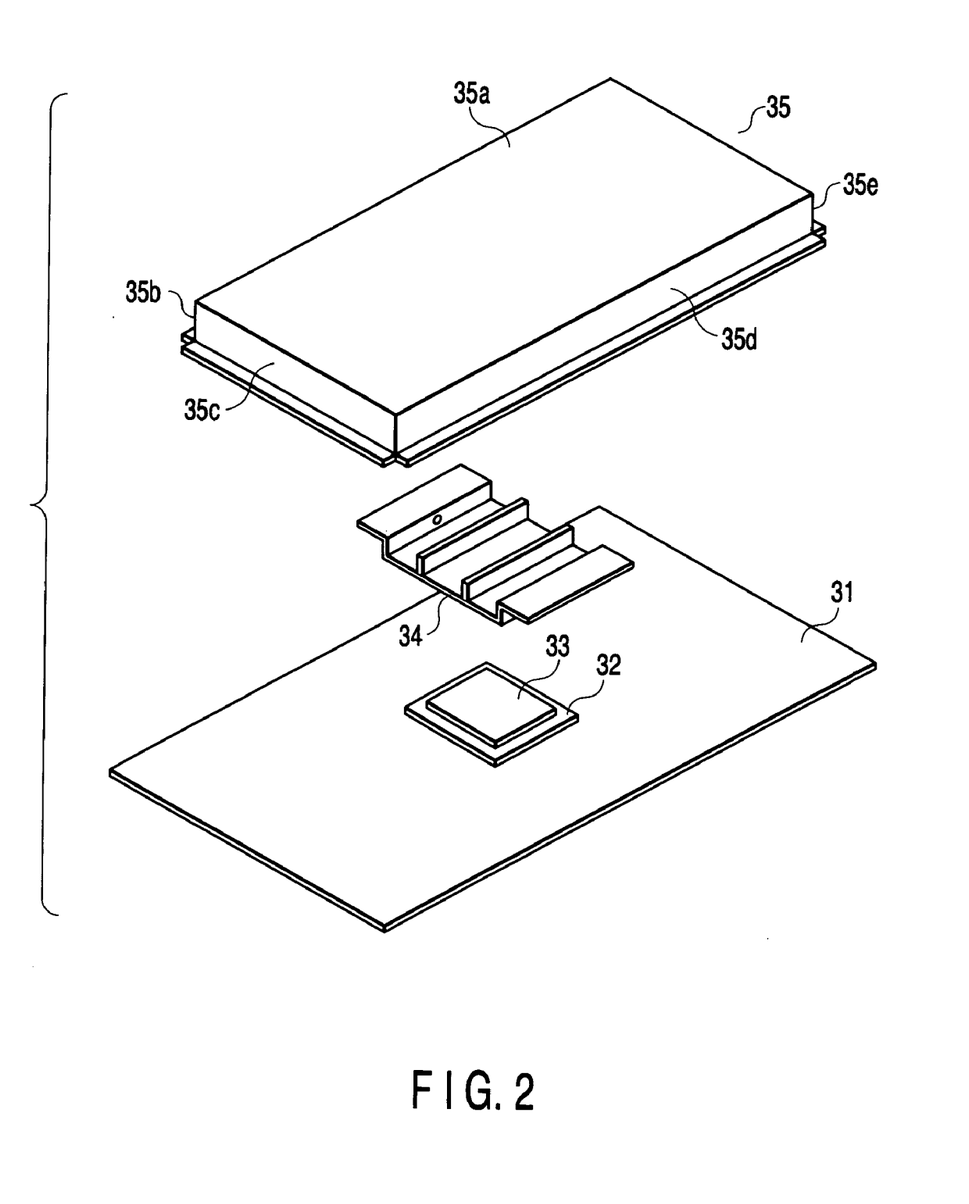
FIG. 2 is an exemplary exploded perspective view of a circuit board on which the video signal processing system of the embodiment is assembled.

FIG. 2 illustrates a circuit board 31 on which the video signal processing system of the television broadcast receiving apparatus 11 is assembled. A plurality of circuit components and circuit patterns are mounted on the circuit board 31 for constructing the video signal processing system. In particular, a component, such as an LSI 32 constituting the decoder unit 15 among the circuit components on the circuit board 31, generates heat from its high-speed processing of digital data and may be adapted with a scheme for radiating the heat.

The scheme for radiating the heat is implemented by a heat sink 34 attached closely by an elastic heat conductive sheet 33 to one side of a substantially four-sided substantially planer surface of the LSI 32 of which the opposite side directly faces the circuit board 31. When positioned to cover the heat sink 34 and electromagnetically shield the LSI 32, the shielding case 35 also electromagnetically shields the circuit components mounted on the surface of the circuit board 31 proximate to the LSI 32.

Figure 3:
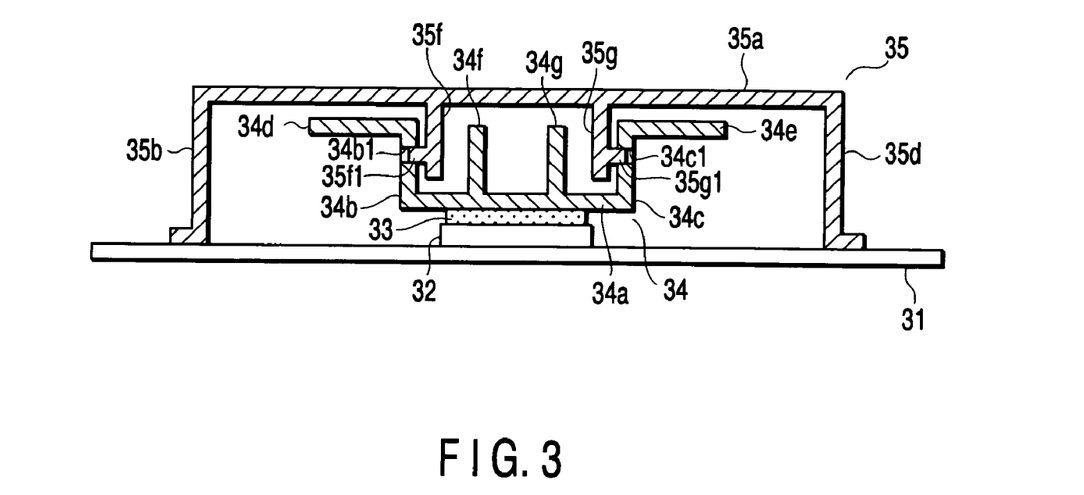
FIG. 3 is an exemplary cross-sectional side view of a mounting structure of a heat sink in the embodiment.

FIG. 3 illustrates a mounting structure of the heat sink 34. The heat sink 34 includes a board 34*a* shaped of substantially a four-sided planer form, a pair of side panels 34*b* and 34*c* extending from two opposite sides of the board 34*a* vertically in the same direction to the board 34*a*, a pair of heat radiating panels 34*d* and 34*e* extending outwardly from the lowermost ends of their respective side panels 34*b* and 34*c* substantially parallel to the board 34*a*, and two or more (two shown) heat radiating panels 34*f* and 34*g* extending from predetermined locations on the upper side of the board 34*a* parallel to the side panels 34*b* and 34*c*, which are all integrally shaped by extrusion forming of a heat conductive material such as a metal material. Each of the two side panels 34*b* and 34*c* of the heat sink 34 has an engaging hole 34*b*1 or 34*c*1 provided therein at an identical location.

The shielding case 35 includes a flat panel 35*a* shaped of substantially a four-sided planer form and four side panels 35*b*, 35*c*, 35*d*, and 35*e* extending from all the sides of the flat panel 35*a* vertically in the same direction to the flat panel 35*a*, which are all integrally shaped by press forming of, for example, a metal material. The shielding case 35 is attached to the circuit board 31 with its four side panels 35*b* to 35*e* directly seating at the notch on the upper surface of the circuit board 31, whereby the circuit components mounted on the circuit board 31 are covered.

Also, the shielding case 35 has two holding panels 35*f* and 35*g* projected from predetermined locations of the flat panel 35*a* for placement opposite to the side panels 34*b* and 34*c* of the heat sink 34 respectively while the shielding case 35 is attached to the circuit board 31. The holding panels 35*f* and 35*g* of the shielding case 35 have projections 35*f*1 and 35*g*1 provided in the side panels 34*b* and 34*c* of the heat sink 34 for fitting into their respective engaging holes 34*b*1 and 34*c*1.

Accordingly, the heat sink 34 and the shielding case 35 are coupled together with the engaging holes 34*b*1 and 34*c*1 formed in the side panels 34*b* and 34*c* of the heat sink 34 closely accepting their respective projections 35*f*1 and 35*g*1 of the holding panels 35*f* and 35*g* of the shielding case 35. In this state, when the shielding case 35 is attached to the circuit board 31, the board 34*a* of the heat sink 34 comes closely into direct contact with the heat conductive sheet 33 thus forming a heat radiating structure.

According to the above-described embodiment, the heat sink 34 and the shielding case 35 are coupled together so that the heat sink 34 comes closely in direct contact with the heat conductive sheet 33 when the shielding case 35 is attached to the circuit board 31. Accordingly, the heat sink 34 need not be pressed against the LSI 32 by the yielding force of a leaf or coil spring. The heat radiating structure of the embodiment can provide a favorable degree of heat radiation with its simple arrangement.

Since the projections 35*f*1 and 35*g*1 of the holding panels 35*f* and 35*g* extending vertically from the flat panel 35*a* of the shielding case 35 are closely fitted into their respective engaging holes 34*b*1 and 34*c*1 in the side panels 34*b* and 34*c* of the heat sink 34, the heat sink 34 is securely coupled with the shielding case 35 without its coupling portions extending outwardly of the flat panel 35*a* of the shielding case 35, thus making the heat radiation structure simple and compact.

It will be understood that the heat radiation structure of the embodiment is not limited to the engaging holes 34*b*1 and 34*c*1 provided in the side panels 34*b* and 34*c* of the heat sink 34 and the projections 35*f*1 and 35*g*1 provided on the holding panels 35*f* and 35*g* of the shielding case 35. Alternatively, the side panels 34*b* and 34*c* of the heat sink 34 may have two projections provided thereon while the holding panels 35*f* and 35*g* of the shielding case 35 have engaging holes provided therein.

Also, the engaging holes 34*b*1 and 34*c*1 provided to extend through the side panels 34*b* and 34*c* may be replaced by corresponding recesses shaped for engaging with the projections 35*f*1 and 35*g*1.

Figure 4:
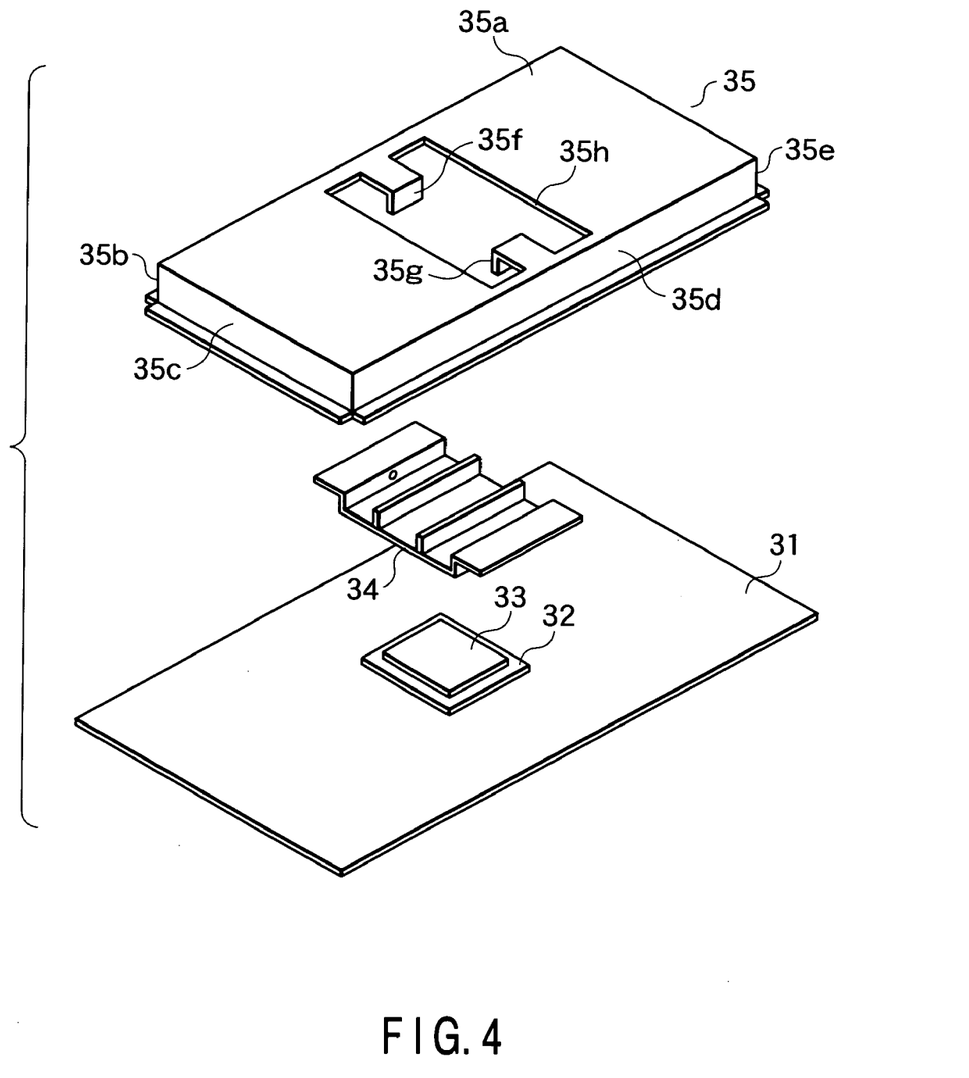
FIG. 4 is an exemplary exploded perspective view showing a modification of the embodiment.

As shown in FIG. 4, the flat panel 35*a* of the shielding case 35 may have a notch 35*h* provided in a heat sink 34 facing portion thereof so that two tabs extend in the notch 35*h*. When the two tabs of the flat panel 35*a* are bent into an L shape, they serve as the holding panels 35*f* and 35*g*. This allows the heat sink 34 to be exposed outwardly through the notch 35*h*, thus increasing the effect of heat radiation.

Figure 5:
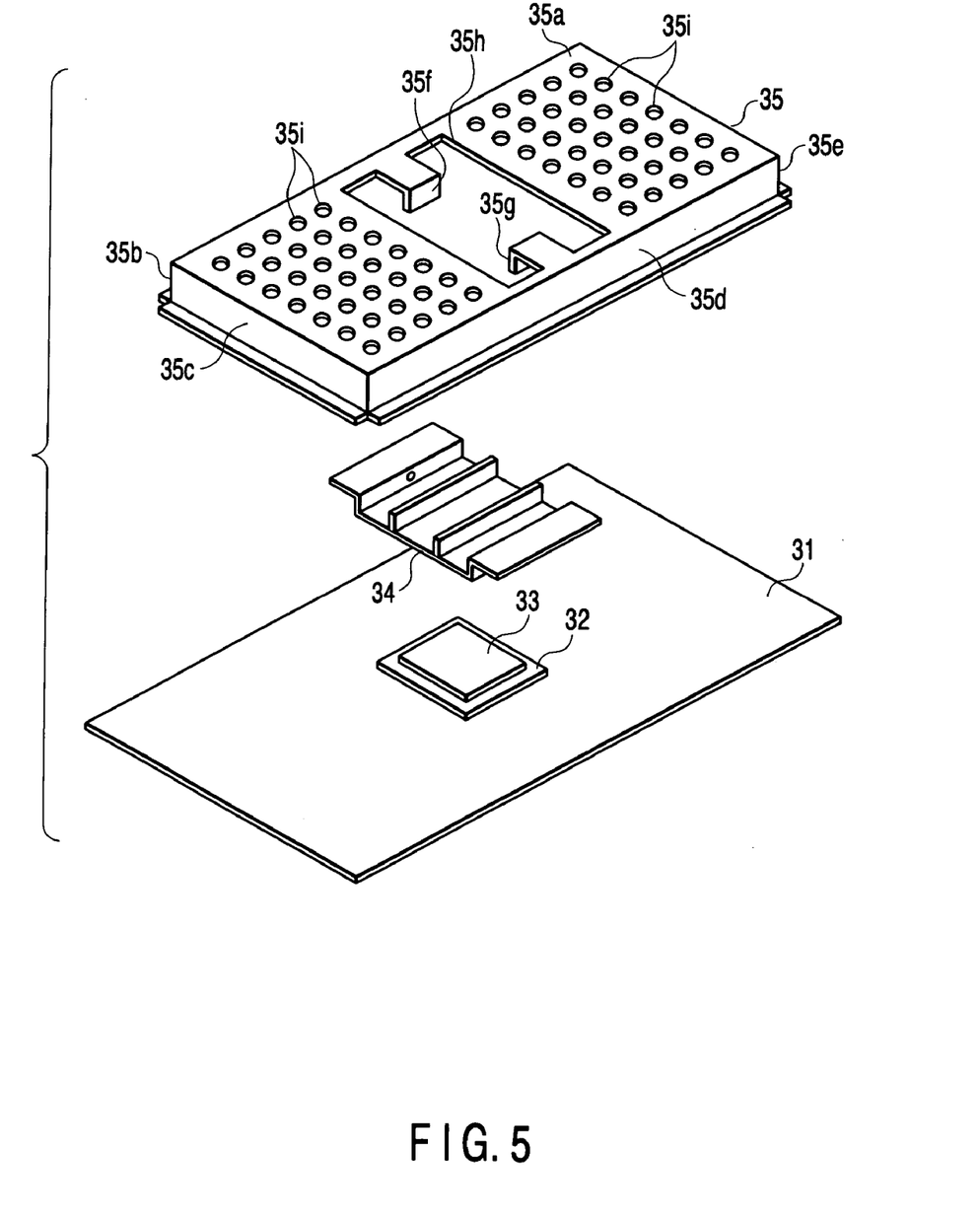
FIG. 5 is an exemplary exploded perspective view showing another modification of the embodiment.

Moreover, as shown in FIG. 5, the flat panel 35*a* of the shielding case 35 has a plurality of perforations 35*i* provided therein so long as the shielding effect is not interrupted. Accordingly, the effect of heat radiation will further be improved.

Figure 6:
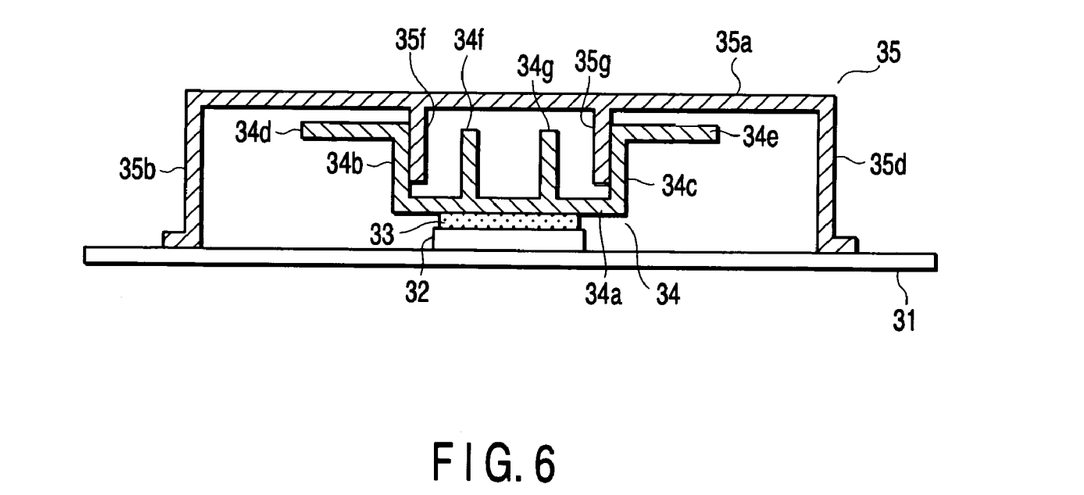
FIG. 6 is an exemplary cross-sectional side view of a mounting structure of a heat sink showing another embodiment of the present invention.

FIG. 6 illustrates another embodiment of the present invention. In FIG. 6, the same components are denoted by the same numerals as those shown in FIG. 3. Holding panels 35*f* and 35*g* extending vertically from a flat panel 35*a* of a shielding case 35 are arranged to remain pressed by and sandwiched between two side panels 34*b* and 34*c* of a heat sink 34. In other words, the heat sink 34 is securely held by the resilient force of the holding panels 35*f* and 35*g*.

This eliminates a combination of the engaging holes 34*b*1 and 34*c*1 and their respective projections 35*f*1 and 35*g*1, thus simplifying the overall arrangement and improving the assembling efficiency in the production.

Figure 7:
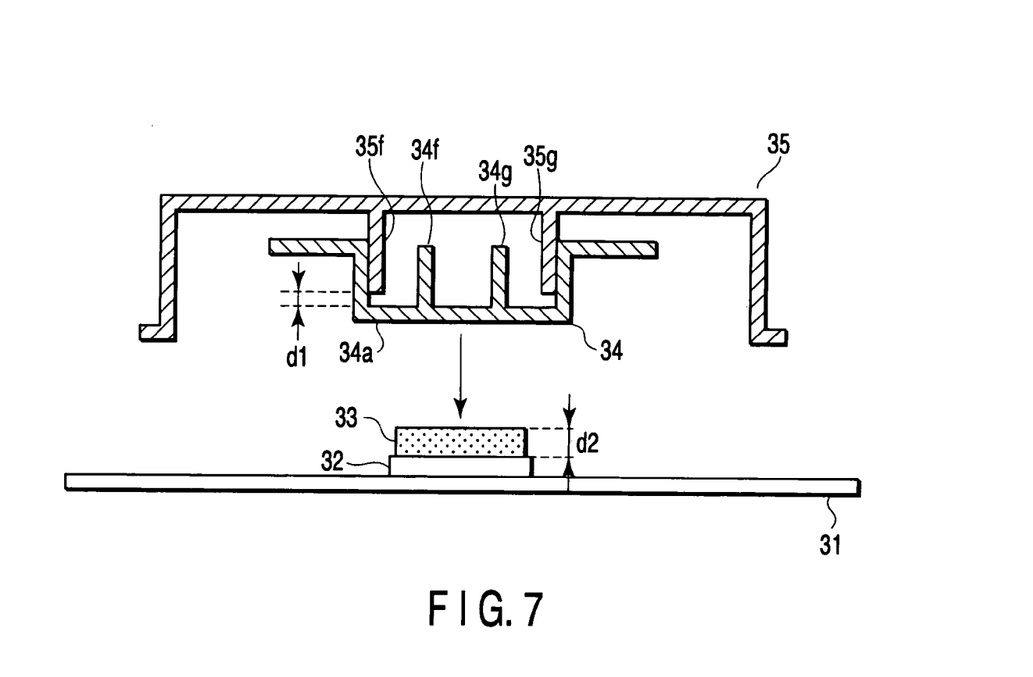
FIGS. 7 and 8 are exemplary cross-sectional side views of a mounting structure of a heat sink showing a further embodiment of the present invention.
Figure 8:
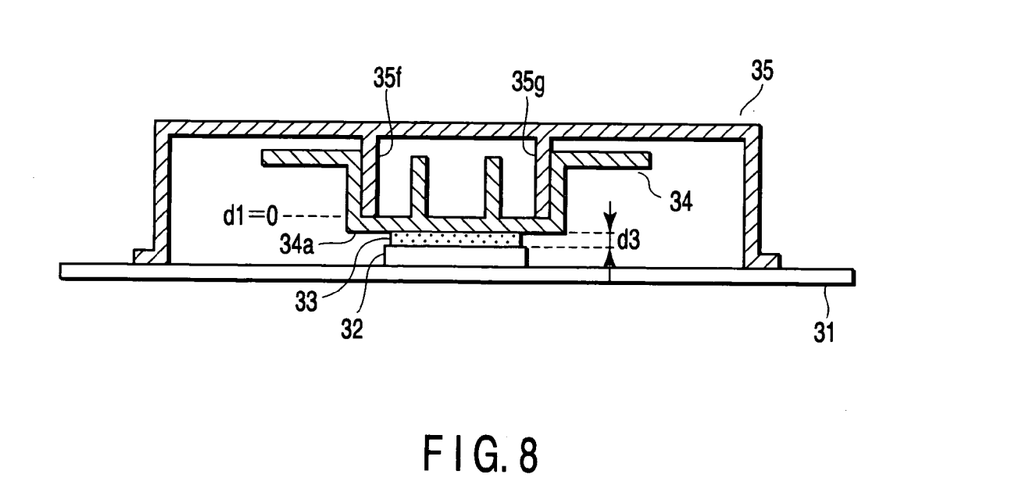

FIGS. 7 and 8 illustrate a further embodiment of the present invention. In FIGS. 7 and 8, the same components are denoted by the same numerals as those shown in FIG. 6. When a shielding case 35 and a heat sink 34 are coupled together with holding panels 35*f* and 35*g* of the shielding case 35 pressed against side panels 34*b* and 34*c* of the heat sink 34 by their resilient force, there is a clearance d1 between the distal end of each of the holding panels 35*f* and 35g and board 34a of the heat sink 34. Simultaneously, the thickness of a heat conductive sheet 33 is d2 (>d1) under a no-load condition.

Then, when the shielding case 35 is lowered from above towards a circuit board 31, the board 34a of the heat sink 34 comes into direct contact with the heat conductive sheet 33. As the heat conductive sheet 33 is depressed with the heat sink 34, the holding panels 35f and 35g of the shielding case 35 slide down along the side panels 34b and 34c of the heat sink 34 and their distal ends come closer to the board 34a of the heat sink 34 to narrow the clearance d1.

When the distal ends of the holding panels 35f and 35g come into contact with the board 34a of the heat sink 34 to reduce the clearance d1 to zero, the heat conductive sheet 33 is subsequently further depressed with the heat sink 34 and its thickness becomes smaller.

Finally, the four side panels 35b to 35e of the shielding case 35 are attached to the circuit board 31 and the thickness of the heat conductive sheet 33 is d3 (<d2) as shown in FIG. 8. The heat conductive sheet 33 is thus sandwiched directly between the heat sink 34 and the LSI 32 on the circuit board 31 under pressure.

As a result, heat generated by the LSI 32 can effectively be transferred across the heat conductive sheet 33 to the heat sink 34 and radiated outwardly at a higher efficiency.

Also, with the holding panels 35f and 35g of the shielding case 35 depressed at the distal end against the heat sink 34, the shielding case 35 and the heat sink 34 remain electrically connected to each other at a favorable stability. Accordingly, the heat sink 34 can act as one part of the shielding case 35 of which the electromagnetic shielding effect will thus be enhanced.

Figure 9:
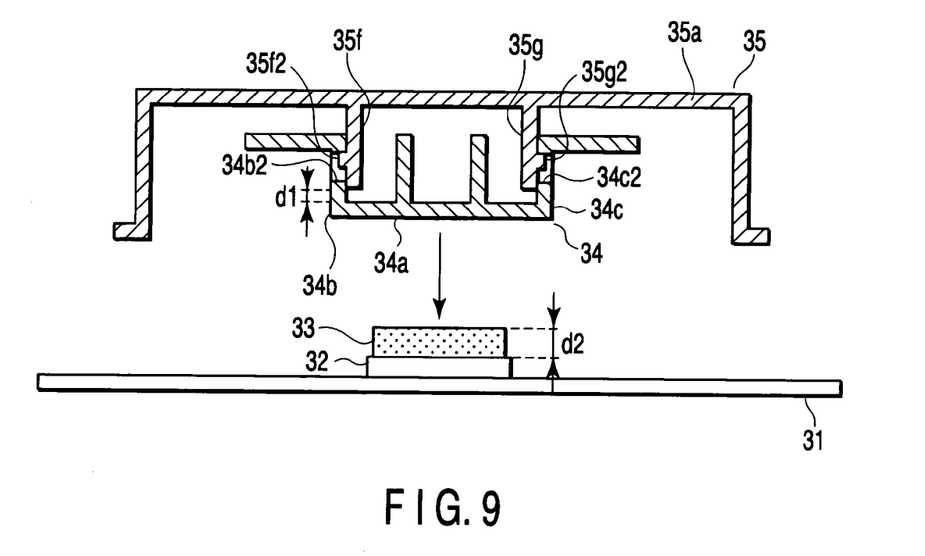
FIGS. 9 and 10 are exemplary cross-sectional side views of a mounting structure of a heat sink showing a still further embodiment of the present invention.
Figure 10:
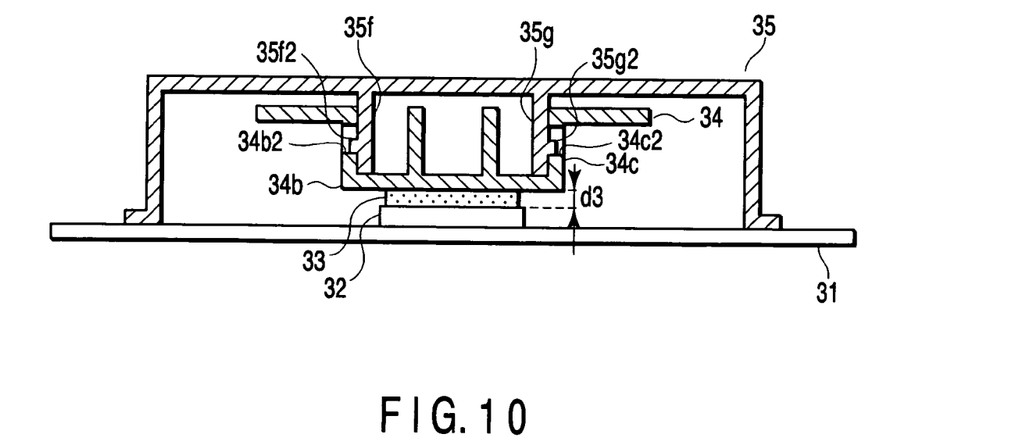

FIGS. 9 and 10 illustrates a still further embodiment of the present invention. In FIGS. 9 and 10, the same components are denoted by the same numerals as those shown in FIGS. 7 and 8. While side panels 34b and 34c of a heat sink 34 have slots 34b2 and 34c2 provided therein, holding panels 35f and 35g of a shielding case 35 have projections 35f2 and 35g2 provided thereon for loosely fitting into the corresponding slots 34b2 and 34c2.

This implements a mounting operation equal to that of the previous embodiment shown in FIGS. 7 and 8, particularly in which the projections 35f2 and 35g2 of the holding panels 35f and 35g of the shielding case 35 remain loosely fitted into the corresponding slots 34b2 and 34c2 in the side panels 34b and 34c of the heat sink 34. As a result, the assembling efficiency in a manufacturing process for securely coupling the heat sink 34 and the shielding case 35 together can be improved.

It will also be understood that the holding panels 35f and 35g of the shielding case 35 in the embodiments shown in FIGS. 6 to 10 are modified to such an arrangement shown in FIG. 4 or the flat panel 35a of the shielding case 35 is modified to have such a plurality of through perforations 35i provided therein as shown in FIG. 5.

The present invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all the components disclosed in the embodiments. Further, components in different embodiments may be appropriately combined.

What is claimed is:

1. A heat radiating apparatus in an electronic device, comprising:

a shielding case having a flat panel arranged in a first direction and a plurality of holding panels arranged in a second direction substantially perpendicular to the first direction, the shielding case being configured to cover a circuit component and a portion of a surface of a circuit board on which the circuit component is mounted; and a heat sink attached to the plurality of holding panels of the shielding case, the heat sink being coupled to the circuit component when the portion of the surface of the circuit board is covered by the shielding case and includes a pair of side panels to apply a force against an outer surface of a first holding panel and an outer surface of a second holding panel of the plurality of holding panels for coupling the heat sink to the shielding case.

2. A heat radiating apparatus in an electronic device, comprising:

a shielding case having a flat panel arranged in a first direction and a plurality of holding panels arranged in a second direction substantially perpendicular to the first direction, the shielding case being configured to cover a circuit component and a portion of a surface of a circuit board on which the circuit component is mounted; and a heat sink attached to the plurality of holding panels of the shielding case, the heat sink being coupled to the circuit component when the portion of the surface of the circuit board is covered by the shielding case and including a plurality of side panels each arranged to engage with a corresponding holding panel of the plurality of holding panels, a first holding panel of the plurality holding panels of the shielding case includes a protrusion that is partially inserted and loosely fitted in a top end of a slot along an inner surface of a first side panel of the plurality of side panels of the heat sink and is securely coupled to a bottom end of the slot when the shielding case is situated to cover the portion of the surface of the circuit board.

3. A heat radiating apparatus in an electronic device, comprising:

a shielding case having a flat panel arranged in a first direction and a plurality of holding panels arranged in a second direction substantially perpendicular to the first direction, the shielding case being configured to cover a circuit component and a portion of a surface of a circuit board on which the circuit component is mounted; and a heat sink attached to the plurality of holding panels of the shielding case, the heat sink being coupled to the circuit component when the portion of the surface of the circuit board is covered by the shielding case and including a plurality of side panels each arranged to engage with a corresponding holding panel of the plurality of holding panels, distal ends of each of the plurality of holding panels of the shielding case is in direct contact with a board of the heat sink coupled to each of the plurality of side panels of the heat sink.

4. An electronic device comprising:

a circuit board on which a circuit component is mounted;

a heat conductive sheet attached to the circuit component;

a shielding case adapted to cover the surface of the circuit board including the circuit component, the shielding case including (i) a flat panel arranged substantially parallel to a surface of the circuit board and (ii) at least a first and second holding panels extending from the flat panel towards the circuit board and arranged at opposite ends to the circuit component; and a heat sink attached to at least the first and second holding panels of the shielding case, the heat sink coming into direct contact with the heat conductive sheet when the circuit board is covered with the shielding case and including a pair of side panels to apply a force against an outer surface of the first holding panel and an outer surface of the second holding panel of the shielding case for coupling the heat sink to the shielding case.

5. An electronic device comprising:

a circuit board on which a circuit component is mounted;

a heat conductive sheet attached to the circuit component;

a shielding case adapted to cover the surface of the circuit board including the circuit component, the shielding case including (i) a flat panel arranged substantially parallel to a surface of the circuit board and (ii) at least a first and second holding panels extending from the flat panel towards the circuit board and arranged at opposite ends to the circuit component; and a heat sink attached to at least the first and second holding panels of the shielding case, the heat sink coming into direct contact with the heat conductive sheet when the circuit board is covered with the shielding case and including a plurality of side panels arranged to engage with the first and second holding panel, the first holding panel of the shielding case includes a protrusion that is partially inserted and loosely fitted in a top end of a slot along an inner surface of a first side panel of the plurality of side panels of the heat sink and is securely coupled to a bottom end of the slot when the shielding case is situated to cover the portion of the surface of the circuit board.

6. A method for radiating heat from an electronic device, comprising:

attaching a heat conductive sheet on a circuit component mounted on a circuit board;

attaching a heat sink to holding panels of a shielding case, the holding panels being arranged at opposite sides of the circuit component and extending towards the circuit board from a flat panel of the shielding case which extends substantially in parallel with the circuit board; and covering a surface of the circuit board including the circuit component with the shielding case so that the heat sink comes into direct contact with the heat conductive sheet, the covering of the surface of the circuit board includes pressing the heat sink directly against the heat conductive sheet in response to a downward force applied by distal ends of the plurality of holding panels of the shielding case when the shielding case is positioned to cover the surface of the circuit board.

7. The method according to claim 6, wherein the covering of the surface of the circuit board includes pressing the heat sink directly against the heat conductive sheet in response to a downward force applied by protrusions of the holding panels engaged with the recesses of the side panels of the heat sink when the shielding case is positioned to cover the surface of the circuit board.

* * * * *